United States Patent
Cho et al.

(10) Patent No.: US 8,750,061 B2
(45) Date of Patent: *Jun. 10, 2014

(54) MEMORY SYSTEM, MEMORY TEST SYSTEM AND METHOD OF TESTING MEMORY SYSTEM AND MEMORY TEST SYSTEM

(75) Inventors: Soo-Haeng Cho, Suwon-si (KR); Ki-jae Song, Paju-si (KR); Sung-dong Suh, Seoul (KR); Kyoung-ho Ha, Seoul (KR); Seong-gu Kim, Pyeongtaek-si (KR); Yeoung-kum Kim, Gochang-gun (KR); In-sung Joe, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/235,162

(22) Filed: Sep. 16, 2011

(65) Prior Publication Data
US 2012/0002495 A1 Jan. 5, 2012

Related U.S. Application Data

(63) Continuation of application No. 12/690,656, filed on Jan. 20, 2010, now Pat. No. 8,023,349.

(30) Foreign Application Priority Data

Feb. 2, 2009 (KR) ........................ 10-2009-0008038

(51) Int. Cl.
*G11C 7/00* (2006.01)
*G11C 29/00* (2006.01)
*G01R 31/308* (2006.01)

(52) U.S. Cl.
USPC ....................... 365/201; 324/754.23; 324/501

(58) Field of Classification Search
USPC .................. 365/201, 64, 201.64; 324/754.23; 398/153
See application file for complete search history.

(56) References Cited

U.S. PATENT DOCUMENTS 5,903,576 A    5/1999  Yoshiba
6,058,227 A *  5/2000  Wong .............................. 385/16
(Continued)

FOREIGN PATENT DOCUMENTS

CN        1204125 A    1/1999

OTHER PUBLICATIONS

Chinese Office Action dated Aug. 28, 2013.

*Primary Examiner* — Huan Hoang
*Assistant Examiner* — Jay Radke
(74) *Attorney, Agent, or Firm* — Muir Patent Consulting, PLLC

(57) ABSTRACT

A memory test system is disclosed. The memory system includes a memory device, a tester generating a clock signal and a test signal for testing the memory device, and an optical splitting module. The optical splitting module comprises an electrical-optical signal converting unit which converts each of the clock signal and the test signal into an optical signal to output the clock signal and the test signal as an optical clock signal and an optical test signal. The optical splitting unit further comprises an optical signal splitting unit which splits each of the optical clock signal and the optical test signal into n signals (n being at least two), and an optical-electrical signal converting unit which receives the split optical clock signal and the split optical test signal to convert the split optical clock signal and the split optical test signal into electrical signals used in the memory device.

14 Claims, 8 Drawing Sheets

(56) References Cited

U.S. PATENT DOCUMENTS

| | | | |
|---|---|---|---|
| 6,134,035 A * | 10/2000 | Krimmel | 398/1 |
| 6,144,471 A * | 11/2000 | Eyberg et al. | 398/1 |
| 6,490,065 B2 * | 12/2002 | Szechenyi et al. | 398/70 |
| 6,586,953 B1 | 7/2003 | Okayasu | |
| 6,766,483 B2 | 7/2004 | Takeuchi | |
| 6,815,973 B1 * | 11/2004 | Conn | 324/750.3 |
| 6,897,663 B1 * | 5/2005 | Conn | 324/754.23 |
| 6,910,162 B2 | 6/2005 | Co et al. | |
| 6,925,018 B2 * | 8/2005 | Tatsumi | 365/201 |
| 6,970,798 B1 | 11/2005 | Cao et al. | |
| 7,109,739 B2 * | 9/2006 | Gothoskar et al. | 324/754.23 |
| 8,023,349 B2 * | 9/2011 | Cho et al. | 365/201 |
| 2002/0044474 A1 | 4/2002 | Takeuchi | |
| 2004/0230880 A1 | 11/2004 | Co et al. | |
| 2005/0053383 A1 * | 3/2005 | West et al. | 398/153 |
| 2005/0194990 A1 * | 9/2005 | Gothoskar et al. | 324/765 |
| 2008/0204055 A1 * | 8/2008 | Pagani | 324/750 |
| 2009/0295415 A1 * | 12/2009 | Pessoa et al. | 324/754 |

* cited by examiner

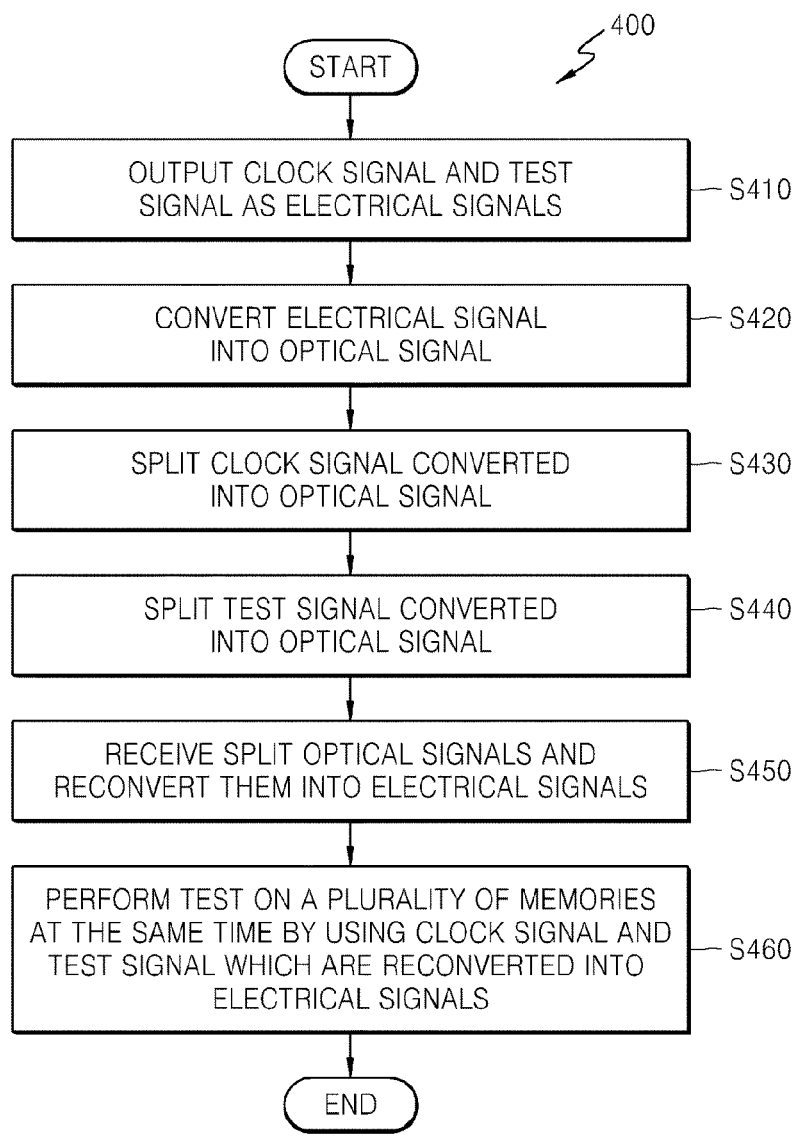

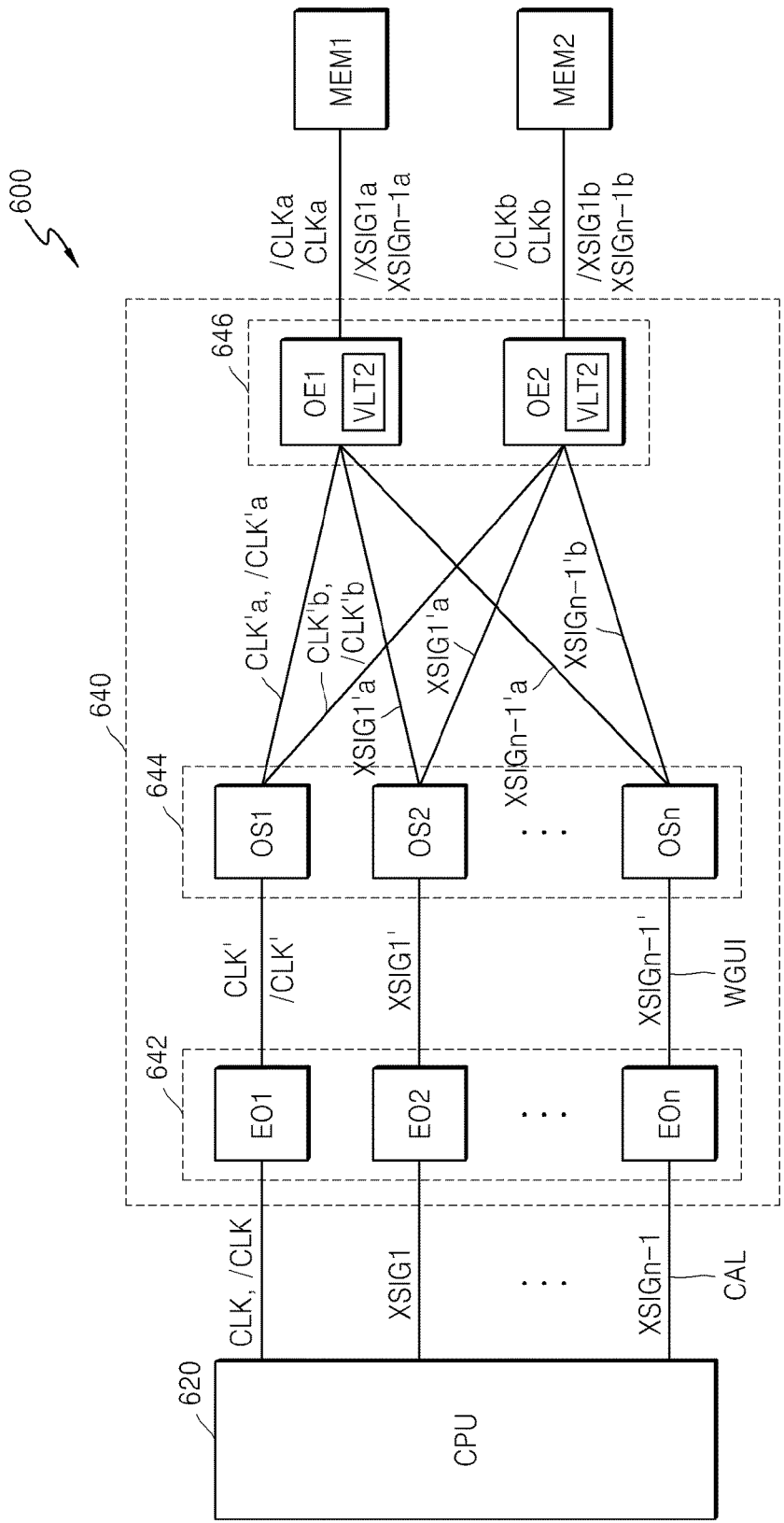

MEMORY SYSTEM, MEMORY TEST SYSTEM AND METHOD OF TESTING MEMORY SYSTEM AND MEMORY TEST SYSTEM

CROSS-REFERENCE TO RELATED APPLICATIONS

This application claims the benefit of priority to and is a continuation of U.S. patent application Ser. No. 12/690,656, filed on Jan. 20, 2010, now U.S. Pat. No. 8,023,349 which claims the benefit of priority to Korean Patent Application No. 10-2009-0008038, filed on Feb. 2, 2009 in the Korean Intellectual Property Office, the disclosures of both of which are incorporated herein in their entirety by reference.

BACKGROUND

This application relates to a semiconductor device, and more particularly, to a memory system and a memory test system, which have a high reliability and perform functions at high speed by optically splitting a clock signal applied to a memory. The application further addresses a method of testing the memory system and the memory test system using optical splitting and a method of manufacturing products using the testing method.

In performing a memory test, the reduction of the test time and cost is important in order to streamline the manufacturing process and reduce the unit cost of a memory. Therefore, research into various methods capable of reducing the test time and cost has been conducted. The disclosed embodiments include a stable test operation performed on a plurality of memories at the same time, in order to reduce cost and expedite the manufacturing process.

SUMMARY

In one embodiment, a memory test system is disclosed. The memory test system includes a memory device, a tester generating a clock signal and a test signal for testing the memory device, and an optical splitting module. The optical splitting module comprises an electrical-optical signal converting unit which converts each of the clock signal and the test signal into an optical signal to output the clock signal and the test signal as an optical clock signal and an optical test signal. The optical splitting unit further comprises an optical signal splitting unit which splits each of the optical clock signal and the optical test signal into n signals (n being at least two), and an optical-electrical signal converting unit which receives the split optical clock signal and the split optical test signal to convert the split optical clock signal and the split optical test signal into electrical signals used in the memory device.

According to another embodiment, a method of testing a plurality of integrated circuit devices is disclosed. The method includes generating a clock signal and a test signal which are used to test the integrated circuit devices, converting the clock signal and the test signal into optical signals and outputting the clock signal and the test signal as an optical clock signal and an optical test signal, splitting the optical clock signal, splitting the optical test signal, receiving the split optical signals and reconverting each of the split optical signals into electrical signals, and performing a test on the plurality of integrated circuit devices at the same time by using the reconverted clock signals and test signals.

According to another embodiment, a memory system is disclosed. The memory system includes at least one memory device, and a memory controller generating a clock signal and a control signal for controlling the at least one memory device. The memory system further comprises an optical splitting module. The optical splitting module includes an electrical-optical signal converting unit which converts each of the clock signal and the control signal into an optical signal and outputs the clock signal and the control signal as an optical clock signal and an optical control signal, and an optical signal splitting unit which splits the optical clock signal and the optical control signal into n signals (n being 2 or more). The memory system further includes an optical-electrical signal converting unit which receives the split optical clock signal and optical control signal and converts the split optical clock signal and optical control signal into electrical signals used in the at least one memory device.

According to yet another embodiment, a method of manufacturing a memory device is disclosed. The method includes forming the memory device as part of a wafer or package that includes at least one other memory device and testing the memory device. In one embodiment, the testing of the memory device and the at least one other memory device is performed using one or more electrical to optical converters, one or more optical splitters that split an optical signal into two or more split optical signals, and one or more optical to electrical converters.

BRIEF DESCRIPTION OF THE DRAWINGS

Exemplary embodiments will be more clearly understood from the following detailed description taken in conjunction with the accompanying drawings in which:

FIG. 4 is a flowchart of an exemplary method of testing a memory, according to one embodiment;

FIG. 6 illustrates an exemplary computer system according to one embodiment;

Figure 1:
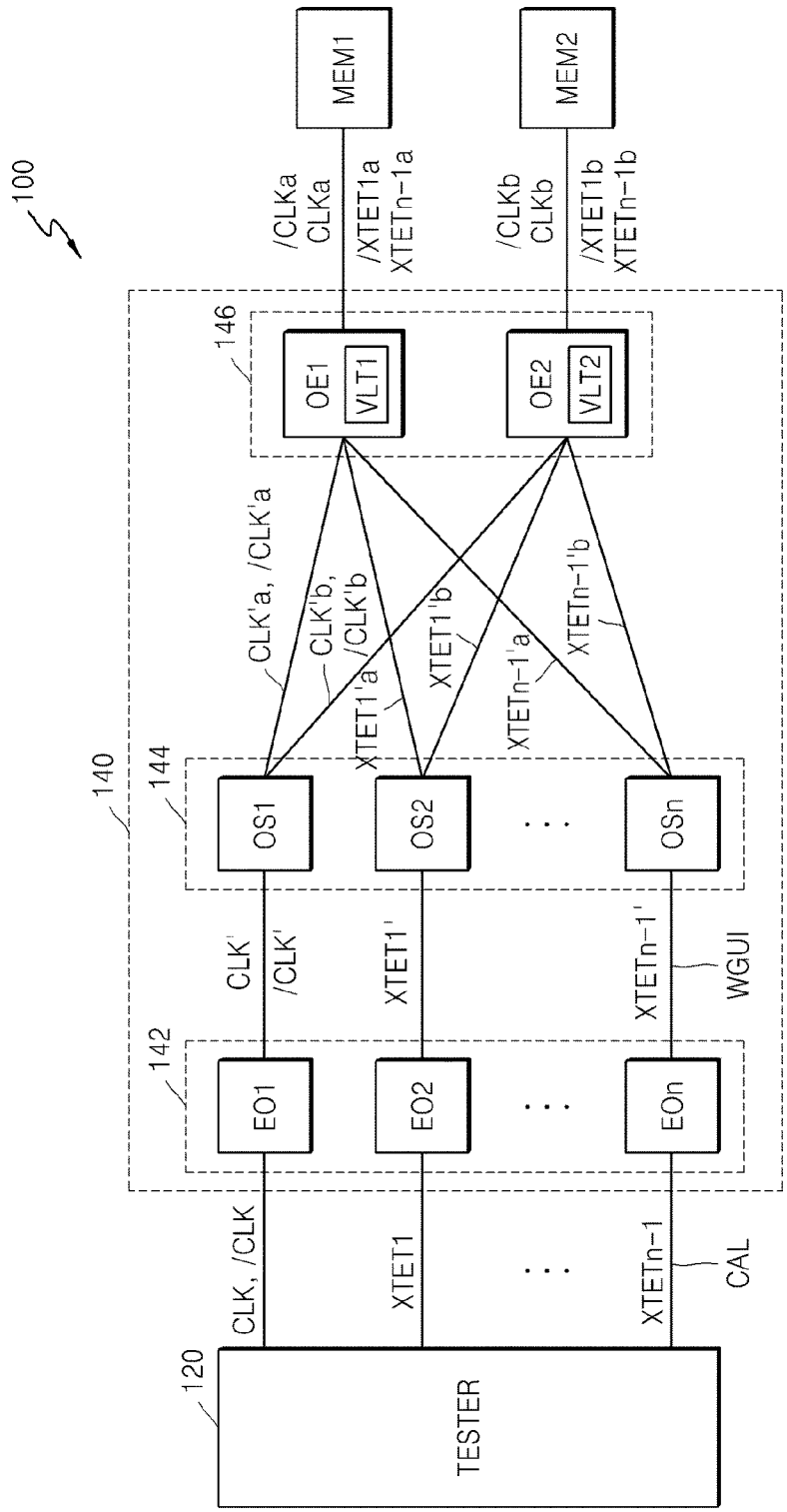
FIG. 1 is a block diagram illustrating an exemplary memory test system according to one embodiment.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative size and positioning components and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings. Example embodiments may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first," "second," etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, unless noted otherwise, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating an exemplary memory test system 100 according to one embodiment.

Referring to FIG. 1, the memory test system 100 may include a tester 120, an optical splitting module 140, and a set of one or more memory devices (e.g., first and second memory devices MEM1 and MEM2). Although testing of memory is specifically shown with respect to FIG. 1, the systems and methods described herein with respect to testing using optical splitting can be applied to test other semiconductor or integrated circuit devices formed on substrates or included in packages. For example, the testing can be applied to controllers, digital signal processors, or other integrated circuits.

The tester 120 generates and outputs a clock signal CLK and test signals XTET1 through XTETn−1 which are applied to the first and second memory devices MEM1 and MEM2 for testing the first and second memory devices MEM1 and MEM2. The test signals XTET1 through XTETn−1 may include test data, an address signal, a command signal, etc., and may be sent through one or more bit lines. For example, each test signal from XTET1 through XTETn−1 may be sent over one bit line, or if a test signal has more than one bit, it may be sent over two or more bit lines (e.g., in parallel).

In the embodiment depicted in FIG. 1, a reversed signal /CLK of the clock signal CLK, as well as the clock signal CLK, is also generated from the tester 120. Thus, one embodiment includes both a CLK and /CLK signal, which may be sent from the tester over two bit lines. Hereinafter, for convenience of description, it is assumed that the reversed signal /CLK of the clock signal CLK is also included in a range of the clock signal CLK. For example, CLK may oscillate between 0.2 V and 1.2 V, and /CLK may also oscillate 180 degrees out of phase and at the same amplitudes, though other values are possible.

Referring to FIG. 1, the first and second memory devices MEM1 and MEM2 (and any additional memory devices) to be tested may be chips or other memory arrays arranged in different forms. For example, MEM1 and MEM2 may be arranged in a package form that includes multiple chips in a package, such that MEM1 and MEM2 are part of the package. Alternatively, MEM1 and MEM2 may be arranged in a wafer form that includes multiple chips on a wafer, such that MEM1 and MEM2 are part of the wafer. In yet another embodiment, MEM1 and MEM2 may be in a memory module form, such that they are arranged on a board including a set of chips and/or a set of chip packages grouped to form a memory module. As such, a test may be performed on multiple memory devices out of a group or set of memory devices.

The tester 120 may perform a test on the first and second memory devices MEM1 and MEM2 at the same time. This could be achieved by, for example, using a tester that has a set of output pins that matches, one-for-one, the number of test signals being sent to the memory devices MEM1 and MEM2 (i.e., if there are two memory devices and each receives 16 test signals and two clock signals, the tester can have 18 pins).

Figure 2:
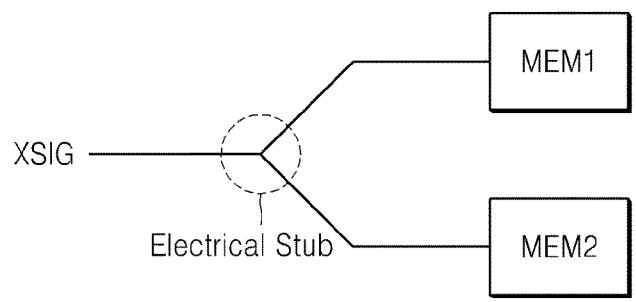
FIG. 2 is a view for explaining splitting of an electrical signal.

However, the number of output pins or output pads on the tester is limited, such that when a large number of test signals are sent to a plurality of memories, the size of the tester may become undesirable. An alternate solution would be to use an electrical splitter for each signal coming from the tester, such that the tester does not need duplicate pins or pads for testing plural memories. As illustrated in FIG. 2, the tester 120 may use a stub or other electrical splitter to split the clock signal CLK or the test signals XEXT1 through XTETn−1 to apply them to the first and second memory devices MEM1 and MEM2. However, this may have undesirable results as well, such as signal distortion.

Figure 3A:
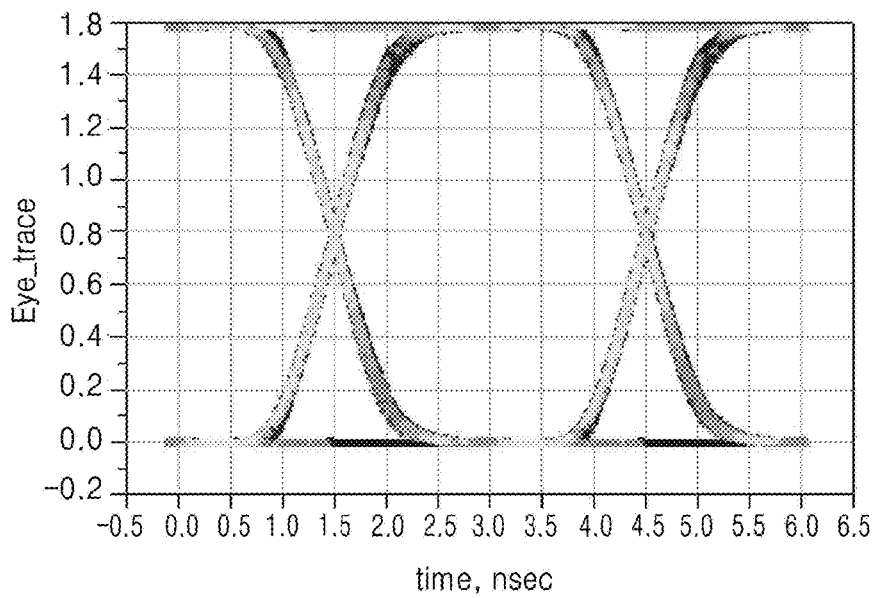
FIGS. 3($a$) and ($b$) are graphs for explaining signal distortion due to the split of an electrical signal.

FIGS. 3(a) and (b) are graphs for explaining signal distortion due to the split of an electrical signal.

Referring to FIG. 3(a), an electrical signal, which is not split, may show a small amount of signal distortion at high and low frequencies. However, when an electrical signal is split, a distortion phenomenon due to a reflected wave and impedance mismatching may result in more distortion, particularly at higher frequencies.

Figure 3B:
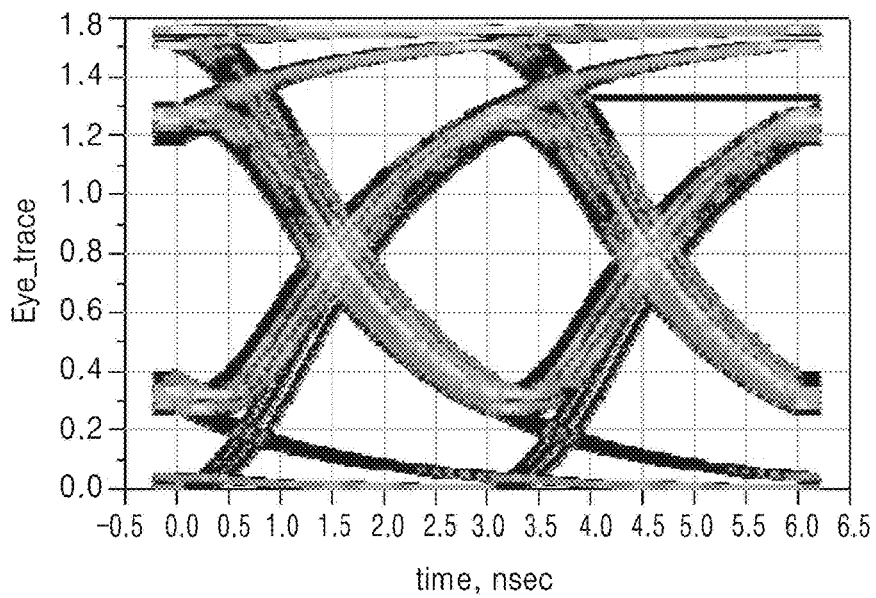

In particular, FIG. 3(b) illustrates a case where the electrical signal is split using a stub method. As illustrated in FIG. 3(b), as the transmission speed of the electrical signal increases, the degree of the distortion phenomenon generated due to the split of the electrical signal increases. Accordingly, a characteristic of the electrical signal may not be easily ensured in a high-speed transmission.

In order to ensure the reliability of a test, the quality of a signal is important. In particular, since the clock signal CLK is often faster than the test signals XTET1 through XTETn−1 and may require a higher signal quality, a characteristic for the clock signal CLK must be ensured.

For this, the memory test system 100 according to one embodiment may include the optical splitting module 140 which optically splits the clock signal CLK and the test signals XTET1 through XTETn−1 to apply them to one or more memory devices. The structure and operations of the optical splitting module 140 of the memory test system 100 according to certain embodiments will now be described in greater detail.

FIG. 4 is a flowchart of an exemplary method 400 of testing a memory, according to one embodiment.

Referring to FIGS. 1 and 4, the tester 120 included in the memory test system 100 outputs the clock signal CLK (and optionally /CLK) and the test signals XTET1 through XTETn−1 as electrical signals (S410). The electrical signals are transmitted to an electrical-optical signal converting unit 142 of the optical splitting module 140 through a coaxial cable CAL or other electrical conduit.

The optical splitting module 140 includes the electrical-optical signal converting unit 142, an optical signal splitting unit 144, and an optical-electrical signal converting unit 146.

The electrical-optical signal converting unit 142 converts the received electrical signal into an optical signal (S420). In one embodiment, the electrical-optical signal converting unit 142 includes an equal number of electrical-optical signal converters EO1, EO2 through EOn−1 as the number of received electrical signals. Other amounts of electrical-optical signal converting units may be used.

The optical signal splitting unit 144 receives the optical signals transmitted via a waveguide WGUI from the electrical-optical signal converting unit 142. The waveguide WGUI may be any optical conduit capable of transmitting optical signals from the electrical-optical signal converting unit 142 to the optical splitting unit 144 (e.g., an optical fiber which may transmit light without dispersing the light, a polymer waveguide, an optical printed circuit board (PCB), or the like).

In one embodiment, the optical signal splitting unit 144 includes optical signal splitters OS1, OS2 through OSn−1 corresponding in number to the number of received optical signals. FIG. 1 illustrates the optical signal splitting unit 144 including the optical signal splitter OS1 with respect to the optical clock signal CLK converted into the optical signal, and the optical signal splitters OS2 through OSn−1 with respect to optical test signals XTET1' through XTETn−1' converted into optical signals.

The optical signal splitter OS1 with respect to an optical clock signal CLK' splits the optical clock signal CLK' into a first optical clock signal CLK'a and a second optical clock signal CLK'b (S430). The optical signal splitters OS2 through OSn−1 with respect to optical test signals XTET1' through XTETn−1' split the optical test signals XTET1' through XTETn−1' into first optical test signals XTET1'a through XTETn−1'a and second optical test signal XTET1'b through XTETn−1'b (S440). Although FIG. 1 illustrates a case where the optical clock signal CLK' and the optical test signals XTET1' through XTETn−1' are split into two signals, the optical signal splitting unit 144 is not limited as such. Optical splitters may be used that split the signal into a greater number of split signals, sent to a greater number of optical-electrical signal converters.

In one embodiment, the optical signal splitters OS1, OS2 through OSn−1 may have a structure formed on a bench through lithography or may be a fused-type coupler manufactured by bonding an optical fiber. Other types of optical signal splitters may be used.

Referring to FIGS. 1 and 4, the optical-electrical signal converting unit 146 converts the first and second optical clock signals CLK'a and CLK'b, the first optical test signals XTET1'a through XTETn−1'a, and the second optical test signals XTET1'b through XTETn−1'b into electrical signals CLKa, CLKb, XTET1a through XTETn−1a, XTET1b through XTETn−1b, which signals may be transmitted to and operated in the first and second memory devices MEM1 and MEM2 (S450). Although the optical-electrical signal converting unit 146 is depicted as part of optical splitting module 140, in one embodiment, an optical-electrical signal converting unit may alternatively be included in each memory device MEM1 and MEM2.

FIG. 1 illustrates an exemplary optical-electrical signal converting unit 146 including a first optical-electrical signal converter OE1 performing optical-electrical conversion of the first optical clock signal CLK'a and the first optical test signals XTET1'a through XTETn−1'a with respect to the first memory device MEM1, and a second optical-electrical signal converter OE2 performing optical-electrical conversion of the optical clock signal CLKb and the second optical test signals XTET1'b through XTETn−1'b with respect to the second memory device MEM2. Additional optical-electrical signal converters may be used when optical splitters are used that split signals into three or more split signals.

The optical-electrical signal converting unit 146 converts optical signals into electrical signals, and may include voltage level converters VLT1 and VLT2 in order to satisfy operation voltage levels of the first and second memory devices MEM1 and MEM2. In one embodiment, the CLK and XTET signals are propagated from each optical-electrical signal converting unit to each respective memory device MEM1, MEM2, etc. through a plurality of bit lines (e.g., in parallel). Depending on the memory devices used, however, some or all of the test signals may be propagated from optical-electrical signal converting units to memory devices in series.

Figure 5A:
FIG. 5($a$) illustrates an exemplary splitter according to one embodiment, and FIG. 5($b$) depicts graphs illustrating waveforms of a clock signal which is optically split by a method of testing the memory test system.
Figure 5B:
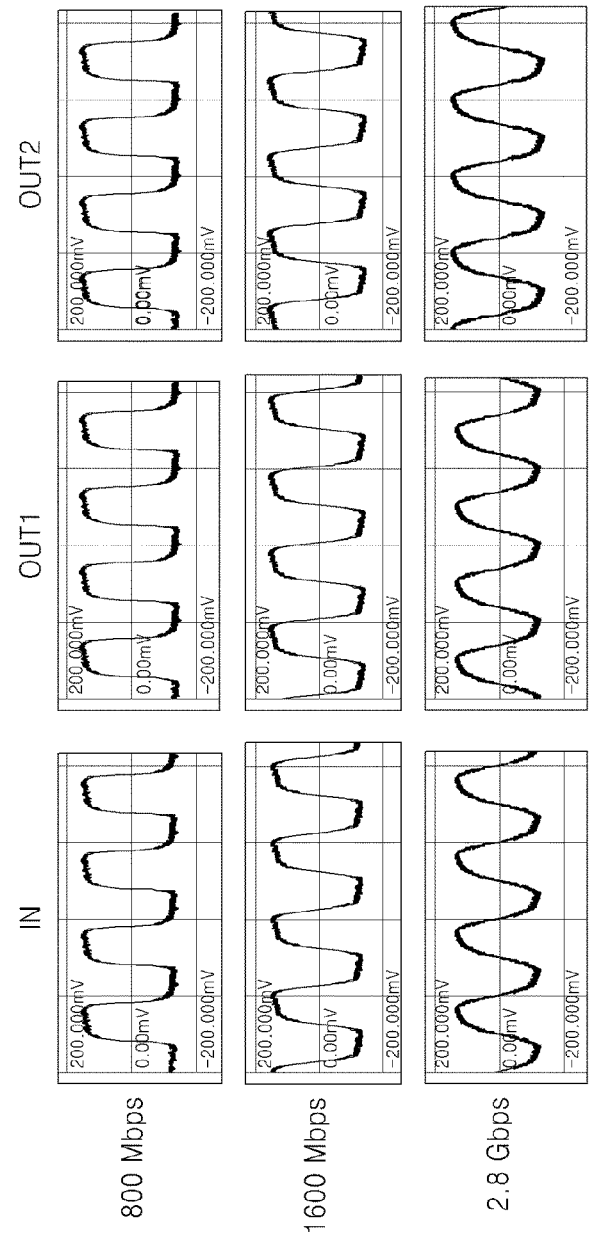

FIG. 5A illustrates an exemplary optical splitter used in a memory test system according to one embodiment, and FIG. 5B depicts graphs illustrating waveforms of a clock signal that is optically split by a method of testing the memory test system.

Referring to FIG. 5A, an optical-type input signal IN may be split into optical-type first and second output signals OUT1 and OUT2 by an optical splitter 1×2 SPLITTER which splits one signal into two signals. FIG. 5B shows exemplary waveforms resulting from signals split by such an optical splitter. As illustrated in FIG. 5B, the split first output signal OUT1 and the second output signal OUT2 have similar waveforms to the waveform of the input signal IN at a high-speed transmission of 800 Mbps, 1420 Mbps, or 2.8 Gbps.

According to the memory test system and the method of testing the memory test system disclosed herein, even though a signal is transmitted at a high-speed to a plurality of memories, the quality of the signal may be maintained by optically splitting a clock signal and a test signal.

In the above description, the case where the quality of a signal is maintained by optically splitting a clock signal in a memory test system has been described. However, the inventive concept is not limited thereto.

FIG. 6 illustrates an exemplary computer system 600 according to one embodiment.

Referring to FIG. 6, the computer system 600 includes a central processing unit (CPU) 620, first and second memory devices MEM1 and MEM2, and an optical splitting module 640. The CPU 620 may transmit a clock signal CLK and signals XSIG1 through XSIGn−1 such as an instruction word, data, an address, etc., to the first and second memory devices MEM1 and MEM2.

The computer system 600 includes the optical splitting module 640 which performs the same function and operations as the optical splitting module 140 of FIG. 1, so that the computer system 600 may optically split a signal applied to the first and second memory devices MEM1 and MEM2 (e.g., for data to be written to or read from the memory devices).

Figure 7:
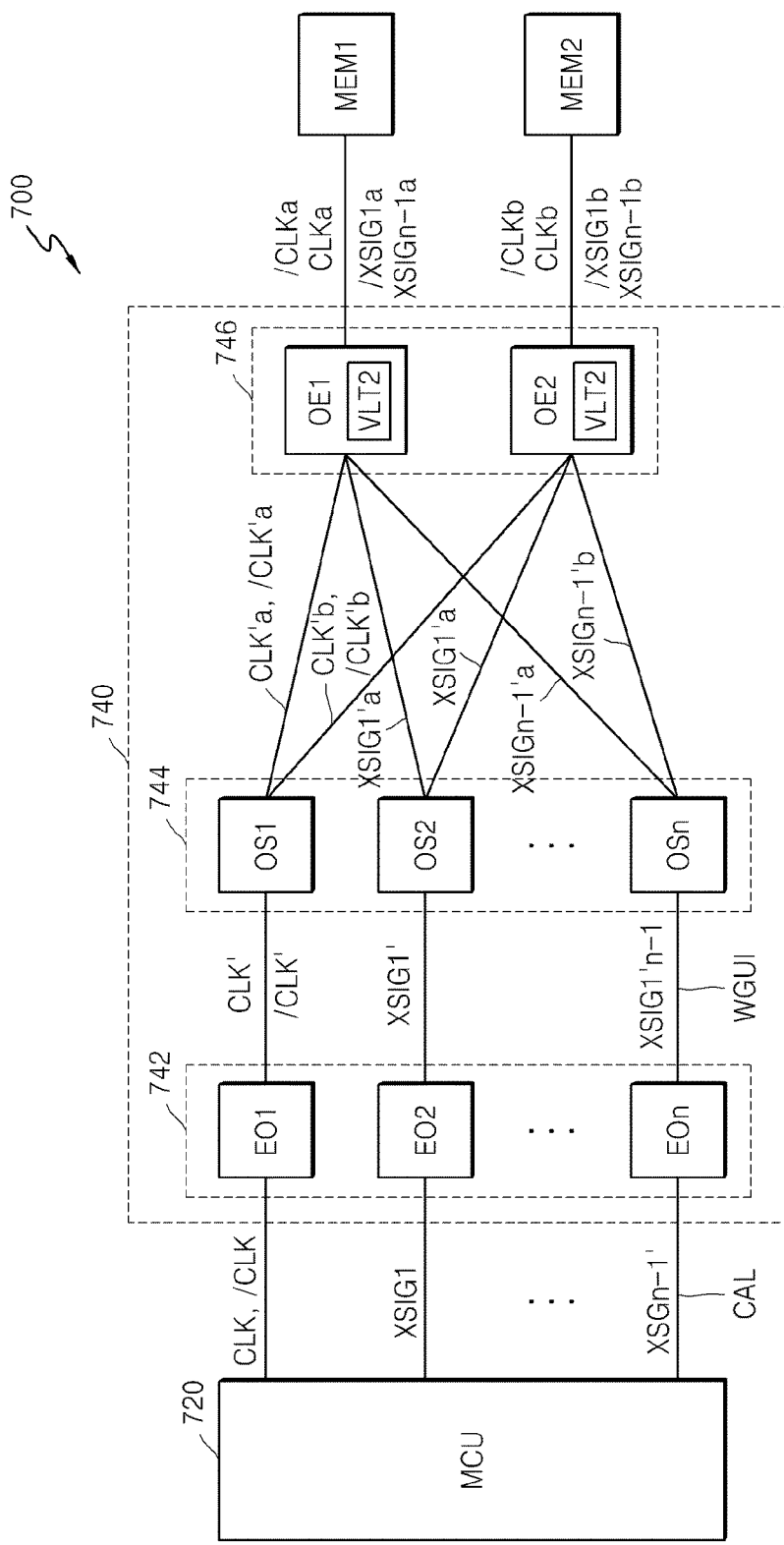
FIG. 7 illustrates an exemplary memory system according to embodiment.

FIG. 7 illustrates an exemplary memory system 700 according to one embodiment.

Referring to FIG. 7, the memory system 700 includes a micro control unit (MCU) 720, first and second memory devices MEM1 and MEM2, and an optical splitting module 740. The MCU 720 may transmit a clock signal CLK and memory control signals XSIG1 through XSIGn−1 such as a command, column address strobe (CAS), row address strobe (RAS), etc., to the first and second memory devices MEM1 and MEM2.

The memory system 700 includes the optical splitting module 740 which performs the same functions and operations as the optical splitting module 140 of FIG. 1, so that the memory system 700 may optically split a signal applied to the first and second memory devices MEM1 and MEM2.

According to the computer system and the memory system described above, the quality of a clock signal can be maintained by optically splitting the clock signal. Therefore, a memory device having limited capacity in a server or personal computer (PC) can be easily extended.

Figure 8:
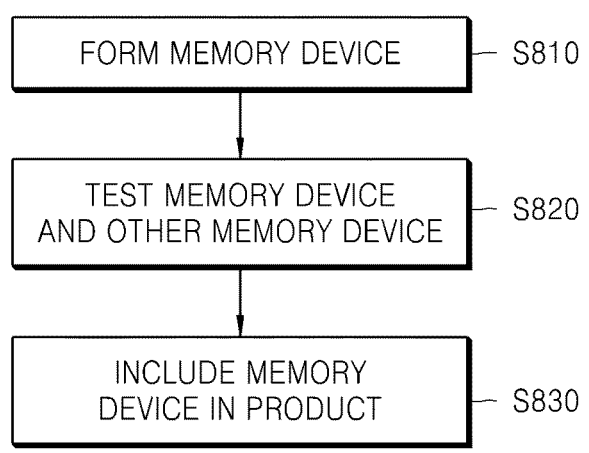
FIG. 8 is a flowchart of an exemplary method of manufacturing devices using the disclosed test methods.

FIG. 8 is a flowchart of an exemplary method of manufacturing devices using the disclosed test methods.

In step S810, a memory device or other integrated circuit device is formed as part of a group of devices (e.g., wafer, module, chip package). In one embodiment, the group includes two or more identical integrated circuit devices. The integrated circuit may be a memory or other logic chip, such as a controller or digital signal processor (which may or may not include embedded memory). The steps to form the integrated circuit in this example comprise providing a wafer substrate (e.g., a crystalline silicon wafer), forming circuitry in and/or on the wafer (e.g., through selective doping of the substrate and forming patterned conductive and insulating layers on and/or in the substrate). The thus formed wafer (the wafer substrate with circuitry) may then be tested at the wafer level and then the individual die areas singulated from the wafer. Alternatively, the individual die areas may be singulated from the wafer and the corresponding chips tested. Chips which test as defective may then be repaired, if possible (e.g., selective cutting of fuses formed with the circuitry of the wafer) to substitute spare circuitry (e.g., spare or redundant memories) for defective circuitry. Then the chips which passed the test and the chips that were repaired may then be packaged and then later assembled into part of a larger device, such as an electronics device (e.g., camera, television, cellular phone, PDA, computer, laptop) or such as a larger memory (e.g., memory module, package on package (POP) devices, solid state disks (SSD), etc.).

As shown in step S820, the integrated circuit device and one or more of the other devices from the group of devices is tested at the same time. For example, the testing may be performed based on one or more of the splitting embodiments discussed above. In one embodiment, the testing is performed using one or more electrical to optical converters, one or more optical splitters that split an optical signal into two or more split optical signals, and one or more optical to electrical signal converters, such as discussed in connection with FIG. 1.

In step S830, if the test is successful (e.g., the testing determines that the device is fully functional or works as expected), or after repairs and a subsequent test that is successful, the device is completed by being placed in or included in a product. For example, if the memory device tested is part of a wafer, it may be included in a chip package or memory module. If the memory device being tested is part of a chip package, it may be included in a memory module or in a consumer electronics device (e.g., cellular phone, USB memory device, etc.).

While various exemplary embodiments have been particularly shown and described herein, it will be understood that various changes in form and details may be made to the disclosed embodiments without departing from the spirit and scope of the following claims.

What is claimed is:

1. A computer system comprising:
a central processing unit (CPU);
a board;
at least a first memory chip and a second memory chip mounted on the board;
an electrical-optical signal converting unit configured to:
  receive a plurality of electrical signals from the CPU including at least a clock signal, control signals, and data signals, and
  convert each of the clock signal, the control signals, and the data signals into respective optical signals, and output the clock signal, the control signals, and the data signals as an optical clock signal, optical control signals, and optical data signals respectively;
a plurality of optical conduits, each optical conduit configured to transmit a respective optical signal output from the electrical-optical signal converting unit;
an optical signal splitting unit configured to:
  receive the optical signals transmitted by the plurality of optical conduits,
  split the optical clock signal into signals,
  split each of the optical control signals into signals, and
  split each of the optical data signals into signals; and
an optical-electrical signal converting unit configured to:
  receive each of the split optical clock signals,
  receive each of the split optical control signals,
  receive each of the split optical data signals,
  convert the received split optical clock signal, split optical control signals, and split optical data signals into converted electrical signals, and
  output a first set of signals of the converted electrical signals to the first memory chip and output a second set of signals of the converted electrical signals to the second memory chip at the same time, wherein the memory chips do not comprise any components included in said optical-electrical signal converting unit.

2. The computer system of claim 1, wherein the optical-electrical signal converting unit includes at least a first converter configured to:
receive a first optical clock signal of the split optical clock signals;
receive a plurality of the split optical control signals;
receive a plurality of the split optical data signals;
convert the first optical clock signal, the received plurality of split optical control signals, and the received plurality of split optical data signals into a first set of the converted electrical signals; and
output the first set of the converted electrical signals to the first memory chip.

3. The computer system of claim 2, wherein the optical-electrical signal converting unit includes at least a second converter configured to:

receive a second optical clock signal of the split optical clock signals;
receive a second plurality of the split optical control signals;
receive a second plurality of the split optical data signals;
convert the second optical clock signal, the received second plurality of split optical control signals, and the received second plurality of split optical data signals into a second set of the converted electrical signals; and
output the second set of the converted electrical signals to the second memory chip.

4. The computer system of claim 3, wherein the computer system is configured to apply the first set of the converted electrical signals output from the first converter to the first memory chip and apply the second set of the converted electrical signals output from the second converter to the second memory chip at the same time.

5. The computer system of claim 1, wherein the control signals are read or write commands.

6. An optical memory system comprising:
a plurality of memory chips comprising first and second memory chips;
an electrical-optical signal converting unit configured to:
receive a plurality of electrical signals including at least a control signal and a data signal, and
convert each of the control signal and data signal into respective optical signals, and output the control signal and the data signal as an optical control signal and optical data signal respectively;
an optical signal splitting unit configured to:
split the optical control signal into signals, and
split the optical data signal into signals; and
an optical-electrical signal converting unit configured to:
receive each of the split optical control signals,
receive each of the split optical data signals, and
convert the received split optical control signals, and split optical data signals into electrical signals, wherein the optical-electrical signal converting unit includes at least a first converter configured to:
receive a first optical control signal of the split optical control signals;
receive a first optical data signal of the split optical data signals;
convert the first optical control signal and the first optical data signal into first converted electrical signals; and
output the first converted electrical signals to the first memory chip,
wherein the optical-electrical signal converting unit includes at least a second converter configured to:
receive a second optical control signal of the split optical control signals;
receive a second optical data signal of the split optical data signals;
convert the second optical control signal and the second optical data signal into second converted electrical signals; and
output the second converted electrical signals to the the second memory chip, and
wherein the plurality of memory chips does not comprise said first and second converters.

7. The optical memory system of claim 6, wherein the optical memory system is configured to apply the first converted electrical signals output from the first converter to the first memory chip and apply and the second converted electrical signals output from the second converter to the second memory chip at the same time.

8. The optical memory system of claim 6, wherein the plurality of electrical signals further include at least a plurality of additional control signals, and a plurality of additional data signals and wherein
the electrical-optical signal converting unit is further configured to
convert each of the plurality of additional control signals and the plurality of additional data signals into respective optical signals, and
output the plurality additional control signals and the plurality of additional data signals as additional optical control signals and additional optical data signals respectively,
the optical signal splitting unit is further configured to split each of the additional optical control signals into signals and split each of the additional optical data signals into signals, and
the optical-electrical signal converting unit is further configured to
receive each of the split additional optical control signals,
receive each of the split additional optical data signals, and
convert the received split additional optical control signals and split additional optical data signals into electrical signals.

9. The optical memory system of claim 6, wherein the plurality of electrical signals further include at least a clock signal, and wherein
the electrical-optical signal converting unit is further configured to convert the clock signal into an optical signal and output the clock signal as an optical clock signal;
the optical signal splitting unit is further configured to split the optical clock signal into signals; and
the optical-electrical signal converting unit is further configured to receive each of the split clock signals and convert the received split clock signals into electrical signals.

10. A computer system comprising:
a central processing unit (CPU);
a board;
at least a first memory chip and a second memory chip mounted on the board;
an electrical-optical signal converting unit configured to:
receive a plurality of electrical signals from the CPU including at least a control signal, a data signal, and a clock signal,
convert each of the control signal, the data signal, and the clock signal into respective optical signals, and output the control signal, the data signal, and the clock signal as an optical control signal, optical data signal, and optical clock signal respectively;
a plurality of optical conduits, each optical conduit configured to transmit a respective optical signal output from the electrical-optical signal converting unit;
an optical signal splitting unit configured to:
receive the optical signals transmitted by the plurality of optical conduits,
split the optical control signal into m signals,
split the optical data signal in m signals, and
split the optical clock signal into m signals;
an optical-electrical signal converting unit configured to:
receive each of the m split optical control signals,
receive each of the m split optical data signals,
receive each of the m split optical clock signals, convert the received m split optical control signals, m split optical data signals, and m split optical clock signals into converted electrical signals, and output a first set of signals of the converted electrical signals to the first memory chip and output a second set of signals of the converted electrical signals to the second memory chip at the same time, wherein m is an integer greater than one and the first and second memory chips do not comprise any components included in said optical-electrical signal converting unit.

11. A computer system comprising:

a central processing unit (CPU);

a board;

at least a first memory chip and a second memory chip mounted on the board;

an electrical-optical signal converting unit configured to:
receive a plurality of electrical signals from the CPU including at least a control signal and a data signal, and
convert each of the control signal and the data signal into respective optical signals, and output the control signal and the data signal as an optical control signal and optical data signal respectively;

a plurality of optical conduits each optical conduit configured to transmit a respective optical signal output from the electrical-optical signal converting unit;

an optical signal splitting unit configured to:
receive the optical signals transmitted by the plurality of optical conduits,
split the optical control signal into m signals, and
split the optical data signal into m signals; and an optical-electrical signal converting unit configured to:
receive each of the m split optical control signals,
receive each of the m split optical data signals,
convert the received m split optical control signals and m split optical data signals into converted electrical signals, and
output a first set of signals of the converted electrical signals to the first memory chip and output a second set of signals of the converted electrical signals to the second memory chip at the same time, wherein m is an integer greater than one and the first and second memory chips do not comprise any components included in said optical-electrical signal converting unit.

12. An optical memory system comprising:

a plurality of electrical-optical signal converters configured to:
receive a plurality of electrical signals including at least a control signal and a data signal, and
convert each of the control signal and the data signal into respective optical signals and output the control signal and the data signal as an optical control signal and optical data signal respectively;

a plurality of optical splitters configured to:
split the optical control signal into signals, and
split the optical data signal into signals;

a plurality of optical-electrical signal converters configured to:
receive the split optical control signals,
receive the split optical data signals, and
convert the received split optical control signals and split optical data signals into electrical signals;

a first memory chip, wherein at least one of the plurality of optical-electrical signal converters is configured to:
receive a first optical control signal of the split optical control signals,
receive a first optical data signal of the split optical data signals,
convert the first optical control signal and the first optical data signal into first converted electrical signals, and
output the first converted electrical signals to the first memory chip; and a second memory chip, wherein at least one of the plurality of optical-electrical signal converters is configured to:
receive a second optical control signal of the split optical control signals,
receive a second optical data signal of the split optical data signals,
convert the second optical control signal and the second optical data signal into second converted electrical signals, and
output the second converted electrical signals to the second memory chip, wherein the first and second memory chips do not comprise any components included in said plurality of optical-electrical signal converters.

13. The optical memory system of claim 12, wherein the plurality of optical-electrical converters comprises a first and a second converter and the optical memory system is configured to apply the first converted electrical signals output from the first converter to the first memory chip and apply and the second converted electrical signals output from the second converter to the second memory chip at the same time.

14. The optical memory system of claim 13, wherein the control signal is a test signal.

* * * * *